United States Patent
Clemens

[19]

[11] Patent Number: 6,118,657

[45] Date of Patent: *Sep. 12, 2000

[54] FAN ATTACHMENT CLIP FOR HEAT SINK

[75] Inventor: Donald Clemens, The Colony, Tex.

[73] Assignee: Thermalloy, Inc., Dallas, Tex.

[ * ] Notice: This patent is subject to a terminal disclaimer.

[21] Appl. No.: 08/869,075

[22] Filed: Jun. 4, 1997

Related U.S. Application Data

[60] Division of application No. 08/621,167, Mar. 22, 1996, Pat. No. 5,677,829, which is a continuation-in-part of application No. 08/482,011, Jun. 7, 1995, Pat. No. 5,590,025.

[51] Int. Cl.[7] .................................................. H05K 7/20
[52] U.S. Cl. ........................ 361/697; 24/458; 165/80.3; 174/16.3; 361/704; 257/719
[58] Field of Search .......................... 24/457, 458, 555, 24/625; 165/80.2, 80.3, 121–122, 185; 174/16.3; 257/706, 707, 712–713, 718–719, 721–722, 726–727; 361/695–697, 690, 704, 707, 709–711, 715, 718, 722

[56] References Cited

U.S. PATENT DOCUMENTS

| | | | |
|---|---|---|---|
| 4,884,331 | 12/1989 | Hinshaw | 29/558 |
| 5,287,249 | 2/1994 | Chen | 361/718 |
| 5,386,338 | 1/1995 | Jordan | 361/704 |
| 5,421,402 | 6/1995 | Lin | 165/80.3 |
| 5,495,392 | 2/1996 | Shen | 361/697 |
| 5,522,700 | 6/1996 | Hong | 415/177 |
| 5,584,339 | 12/1996 | Hong | 361/697 |
| 5,594,623 | 1/1997 | Schwegler | 361/710 |

OTHER PUBLICATIONS

Thermalloy Semiconductor Acessories Catalog, 1990, pp. 15–29.

*Primary Examiner*—Gregory D. Thompson
*Attorney, Agent, or Firm*—Woodcock Washburn Kurtz Mackiewicz & Norris LLP

[57] ABSTRACT

A clip secures a pin fin heat sink to a fan. The clip includes a frame having a width which can be wedged between the fins of the heat sink. Blades extend downwardly from the frame and bear against the heat sink fins to secure the frame to the heat sink. The clip is locked in place by barbs which extend upwardly to engage the fins of the heat sink when the clip is urged in a direction which would free it of the heat sink.

24 Claims, 5 Drawing Sheets

FAN ATTACHMENT CLIP FOR HEAT SINK

RELATED APPLICATIONS

This is a division of application Ser. No. 08/621,167, filed on Mar. 22, 1996 now U.S. Pat. No. 5,677,829 of Donald Clemens entitled "Fan Attachment Clip For Heat Sink", which is a continuation-in-part of Ser. No. 08/482,011 filed Jun. 7, 1995, now U.S. Pat. No. 5,590,025 granted Dec. 31, 1996.

BACKGROUND OF THE INVENTION

This invention relates to a clip for attaching a fan to a heat dissipating heat sink.

Many semiconductor devices generate heat during operation which must be dissipated to avoid damage to the device. Some such devices have power-handling limitations which are largely determined by their ability to expel internally-generated heat and thereby avoid general or localized thermal degradations or failures within them.

In some semiconductor devices, the internally-generated heat is dissipated sufficiently by the enclosure, header or leads of the device. In many semiconductor devices, however, it is necessary to aid the dissipation of internally-generated heat by the use of heat sinks. A wide variety of heat sink designs have been employed for dissipation of internally-generated heat from electronic device packages which house semiconductor devices. For the purposes of the present invention, a heat sink is a body of metal or like material which is placed in contact with an electronic device package for transferring internally-generated heat from the semiconductor device contained in the electronic device package and for rapid dissipation of the internally-generated heat to the atmosphere by conduction, convection and/or radiation.

U.S. Pat. No. 4,884,331—Hinshaw shows a widely used heat sink commonly referred to as a pin fin heat sink. The heat sink has rows and columns of upstanding parallel fins. The heat sinks are formed by first extruding rows of upstanding fins and then cross-cutting the fins to form rows and columns of pin fins.

These devices are frequently adequate to cool electronic devices by themselves. However, in many applications, it is desirable to add a fan which blows cooling air over the fins of the heat sink. The prior art technique of securing a fan to heat sink is by inserting a screw, or like fastener, through the mounting holes of the fan into the space between upstanding pin fins. This is not satisfactory, because often a space between pin fins does not line up with all of the mounting holes on the fan. The clip of the present invention obviates this problem.

It is an object of the present invention to provide a clip which makes the assembly of the fan to a heat sink much easier.

SUMMARY OF THE INVENTION

In accordance with the present invention, a clip includes a frame having a width which can be wedged between the fins of the heat sink. The clip has means to secure the fan to the frame. The frame is wedged between the fins of the heat sink and then locked in place. The rectangular shape of the frame fits between rows and columns of fins on the heat sink.

The frame is formed from a sheet of resilient metal. The blades extend downwardly from the frame. Blades are inserted between the columns of pin fins in the space formed by cross-cutting.

The clip of the present invention has important advantages when assembled with the blade between columns of pin fins formed by cross-cutting. The cross-cut gap between columns of pin fins is narrow and of a constant dimension. Because of this, the clip of the present invention will always provide good engagement and locking in the heat sink. On the other hand, the gap between the extruded rows of pin fins varies depending upon the size of the heat sink. One size clip will not wedge in the extruded rows of all heat sinks.

The insertion of the clip of the present invention into cross-cut gaps between columns of pin fins has another important advantage. The fins often have better strength in the extruded direction and this is the direction against which the locking force of the clip is applied.

The clip of the present invention is adaptable to different sizes of heat sinks and it is adaptable to different types of fans. The clip of the present invention can be inserted into heat sinks having relatively long or relatively short pin fins. In the longer pin fin heat sinks, the clip does not bottom out at the base, but the clip is securely locked in place.

The clip can be used to mount fans of various types. These include fans which have slots or holes at the corners.

Further in accordance with the invention, the blades of the frame have arcuate cut-outs. The arcuate cut-out traps a Z clip in the heat sink. This aids in the assembly of a heat sink with a socket wherein the Z clip secures the heat sink to an electronic device.

Further in accordance with the invention, the extruded fins of the heat sink have a ridge or a notch to hold the frame in place in the heat sink. This prevents the fan assembly from pulling off the heat sink. The ridge or notch is extruded into the extrusion before it is cross-cut to make a pin fin heat sink, but the invention can also be used on an extruded heat sink.

In accordance with another modification of the invention, the fins of the heat sink are serrated to form a series of notches and ridges. The fan clip is pushed to a desired, appropriate depth. The clip fits into the notch at this depth. Instead of being latched into a specific notch or ridge, some flexibility in positioning the clip on the heat sink is provided.

Further in accordance with the invention, a nub on the clip prevents the clip and fan from sliding sideways in the heat sink. The nub fits between two pins in a pin fin heat sink to prevent sideways motion.

The foregoing and other objects, features and advantages of the invention will be better understood from the following more detailed description and appended claims.

SHORT DESCRIPTION OF THE DRAWINGS

FIG. 5 is an exploded view of a fan, the clip of the present invention, a Z-spring retainer, a pin fin heat sink, an electronic device, and a socket;

DESCRIPTION OF THE PREFERRED EMBODIMENT

Figure 1:
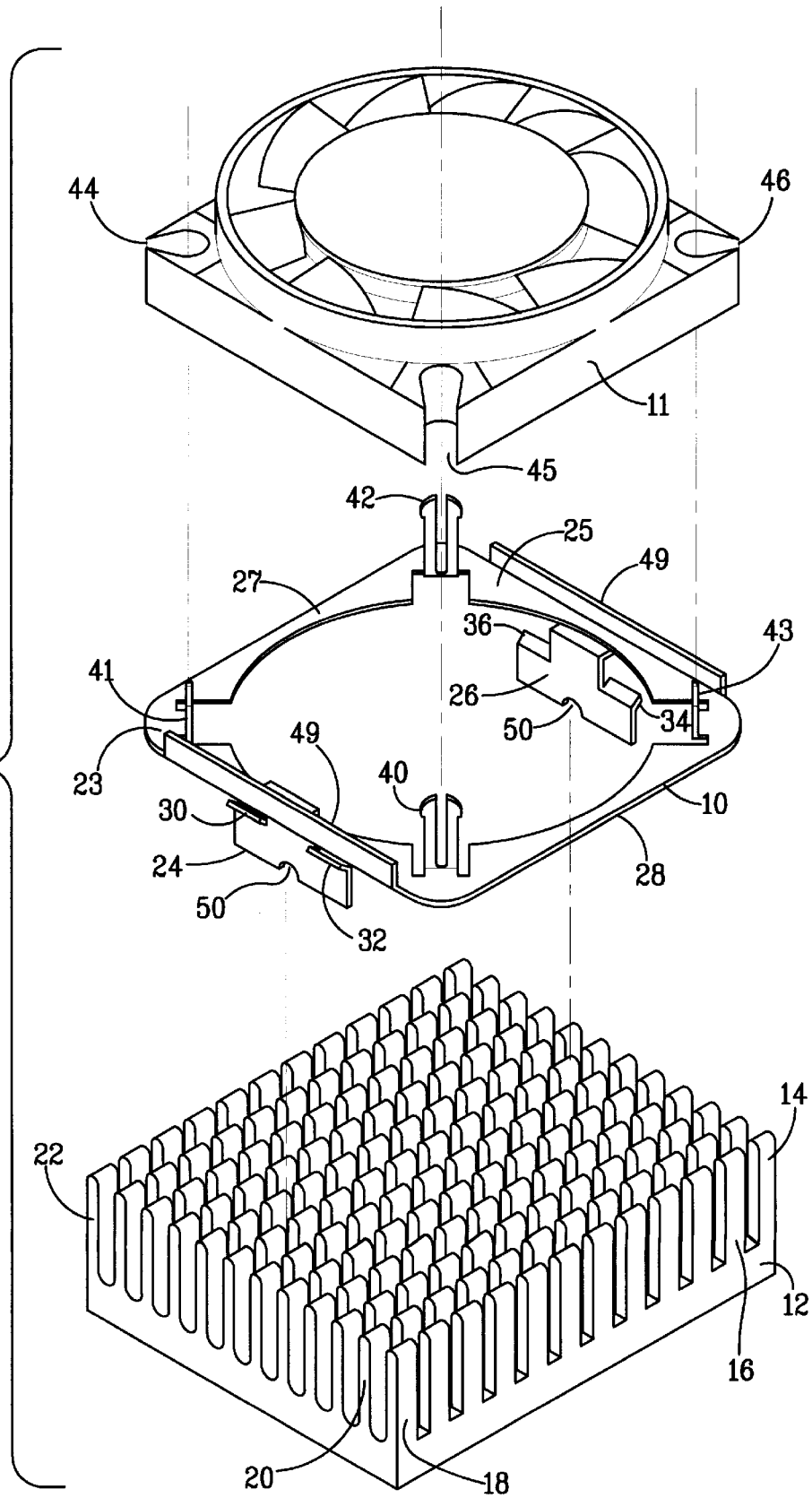
FIG. 1 is an exploded view of a fan, a heat sink and the clip of the present invention.

The clip of the prevent invention includes a frame 10 having a width which can be wedged between the fins of the heat sink 12. Heat sink 12 is of the type made in accordance with the aforementioned '331 Hinshaw patent. It has pin fins 14, 16, . . . 18 in one row and similar fins in parallel rows. These rows of fins are extruded during the manufacturing process. Then, the rows of fins are cross-cut to form columns of pin fins. For example, pin fins 18, 20 . . . 22 are in a first column and there are successive parallel columns of pin fins.

The clip has a width which can be wedged between parallel columns of pin fins. Blades 24 and 26 extend downwardly from the frame. (Hereinafter the words "upwardly" and "downwardly" will be used to describe elements as viewed in the drawings, but it will be understood that these are relative terms which depend upon the direction from which those elements are viewed.) Blades 24 and 26 bear against the fins to secure the frame in the heat sink after it has been inserted therein. Sides 23 and 25 of the frame fit between adjacent columns of pin fins and sides 27 and 28 fit between adjacent rows of pin fins.

Figure 4:
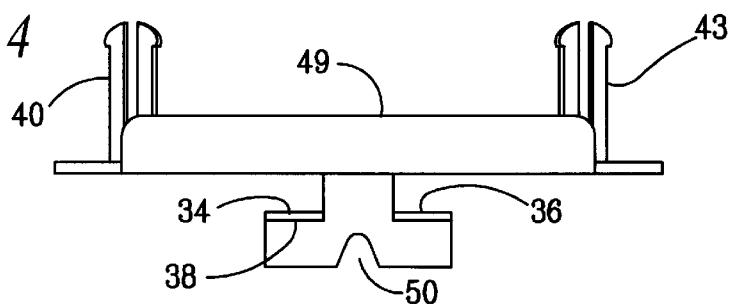
FIG. 4 is a side view of the clip.

Tabs 30, 32, 34 and 36 lock the frame in the heat sink after it has been inserted. Tab 34 extends upwardly and outwardly from a bend line 38 (FIG. 4) along which the tab is bent out of the plane of the blade. The tab lockingly engages a fin against movement in the direction out of the heat sink. The tabs bite into the metal of the pin fins when upward pressure is exerted so that the frame is locked in the heat sink.

The clip is made of resilient metal such as stainless or plated steel. The clip is formed from a sheet of this resilient metal such that the width of the sheet forms the blades 24 and 26 which fit between the columns of the pin fins. Each of the blades spans one or more rows of the pin fins.

Figure 2:
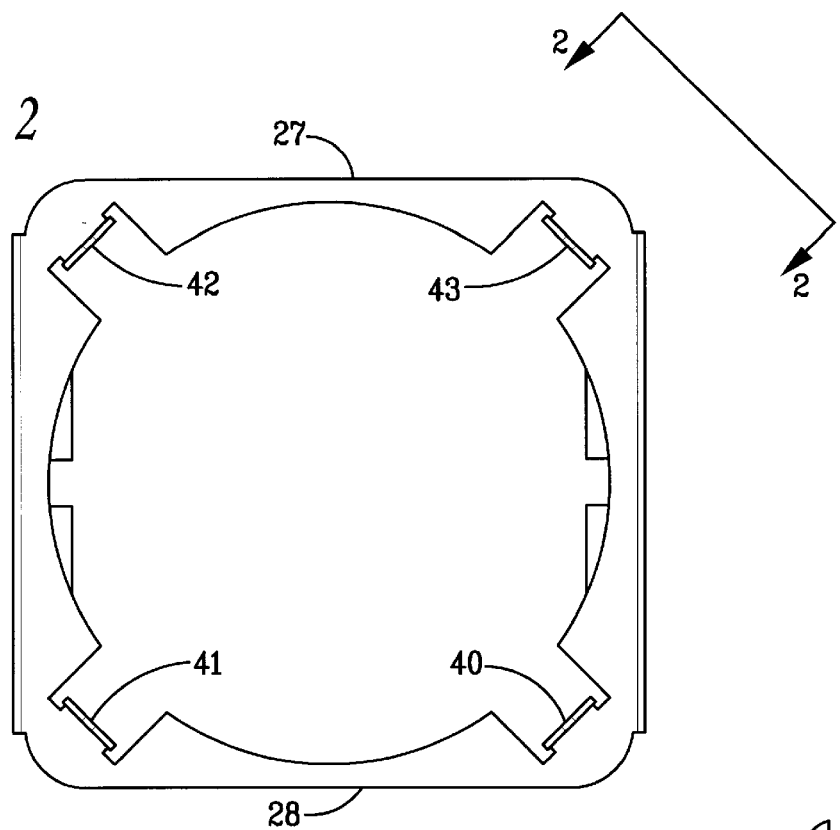
FIG. 2 is a top view of the clip.
Figure 2A:
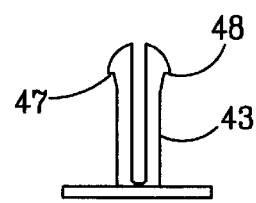
FIG. 2A is a view of the clip on the line A—A.
Figure 3:
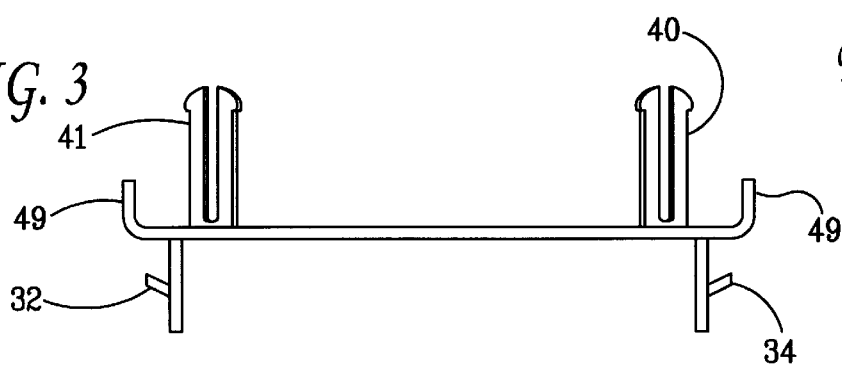
FIG. 3 is a front view of the clip.

Upstanding corner posts 40–43 engage the fan 11 to secure it to the frame 10. As best shown in FIG. 2A, each corner post is bifurcated so that it compresses as it is pushed into the slots 44 of the fan. The corner posts may also be pushed into mounting holes in the fan. Each corner post has barbs 47, 48. These barbs snap over the top lip of the slots 44–46 to lock the fan to the clip. Alternatively, when a fan has holes, instead of slots, the barbs dig into the hole to lock the fan to the clip.

Two edges 49 of the frame are turned upwardly to form a strengthening rib. This provides stability to the frame.

Each of the blades has an arcuate cut-out 50. Arcuate cut-out 50 accommodates a wire clip 52 (FIG. 5) which secures the heat sink to a socket. Pages 15–29 of the Thermalloy catalog 90-HS-11, Thermalloy Semiconductor Accessories, show clips for attaching heat sinks to electronic devices. Z-clip 52 is trapped by the arcuate cut-outs 50 in the blades of the clip 10. The Z clip is engaged by the protrusion 53 on socket 54. In this manner, the assembly of socket 54, electronic device 55, heat sink 12, clip 10 and fan 11 are held together.

Figure 6:
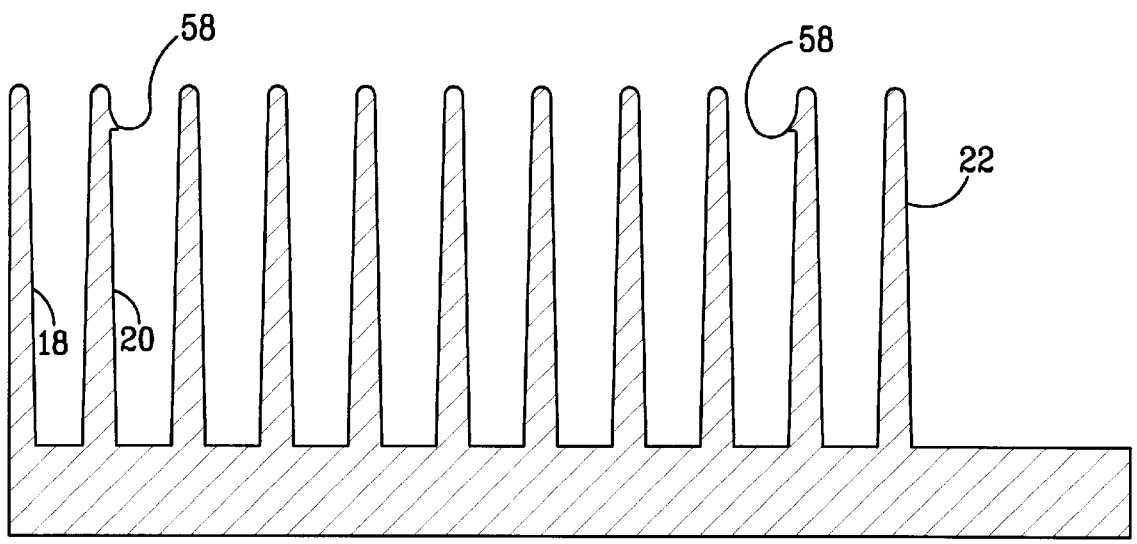
FIG. 6 shows a modification of the heat sink with a notch for holding the clip in place.
Figure 7:
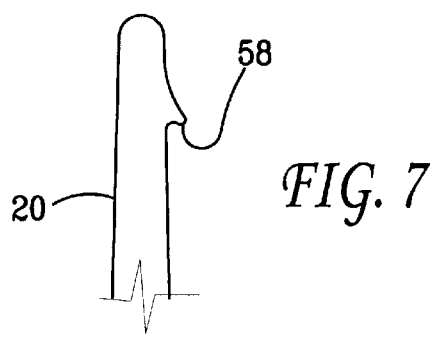
FIG. 7 is an enlarged view of the notch of FIG. 6.

FIGS. 6 and 7 show a modification in which the heat sink fin 20 has a ridge 58 which holds the clip in place on the heat sink. The ridge 58 is formed during the extrusion of the fins 18, 20, . . . 22. The ridge 58 holds the fan assembly including the frame on the heat sink so that the frame cannot be pulled off the heat sink. The ridge 58 is extruded on the fin before the heat sink is cross-cut to make a pin fin heat sink.

Figure 8:
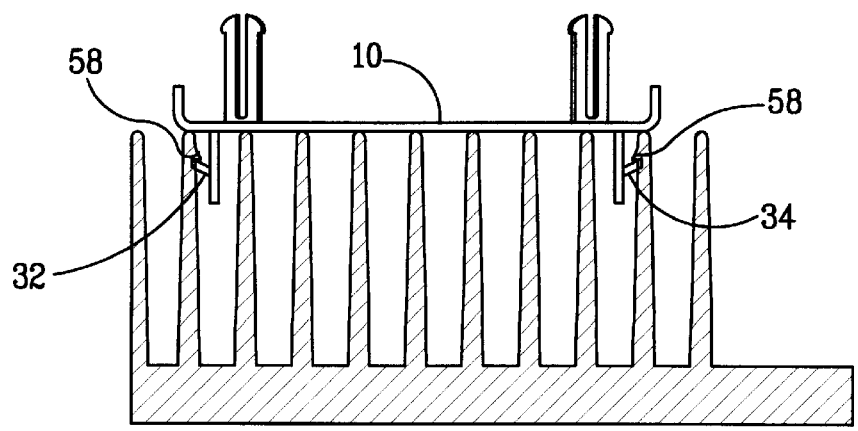
FIG. 8 shows the clip in place on the heat sink.

FIG. 8 shows the frame 10 in place on the heat sink with the tabs 32, 34 securely locked under projection 58.

Figure 9:
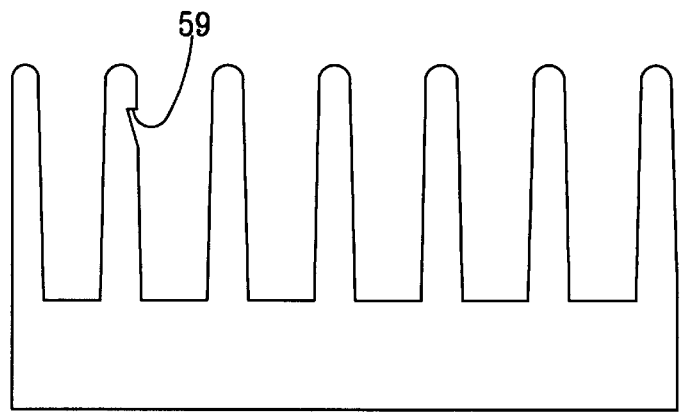
FIG. 9 is another modification wherein a notch on the fins of the heat sink holds the clip in place.

FIG. 9 shows another modification in which a notch 59 is formed in at least one extruded fin to hold the clip, and fan assembly, on the heat sink. In similar manner, the tabs 30, 32, 34, and 36 snap into a notch on the fins to hold the clip in place.

Figure 10:
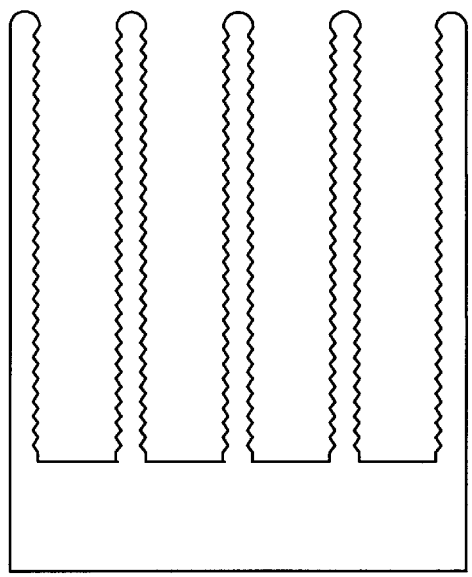
FIG. 10 shows a modification in which the fins are serrated to form a series of notches and ridges to hold the clip in place at a desired depth of the heat sink.
Figure 11:
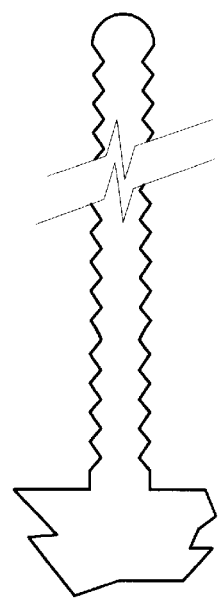
FIG. 11 is an enlarged view of a fin of FIG. 10.

FIGS. 10 and 11 show a modification in which the fins of the heat sink are serrated to form a series of ridges and notches which hold the frame at a desired depth in the heat sink. The frame is pushed to an appropriate depth in the heat sink rather than hooking onto a specific notch. This allows flexibility in assembling the heat sink, frame and fan into an assembly.

Figure 12:
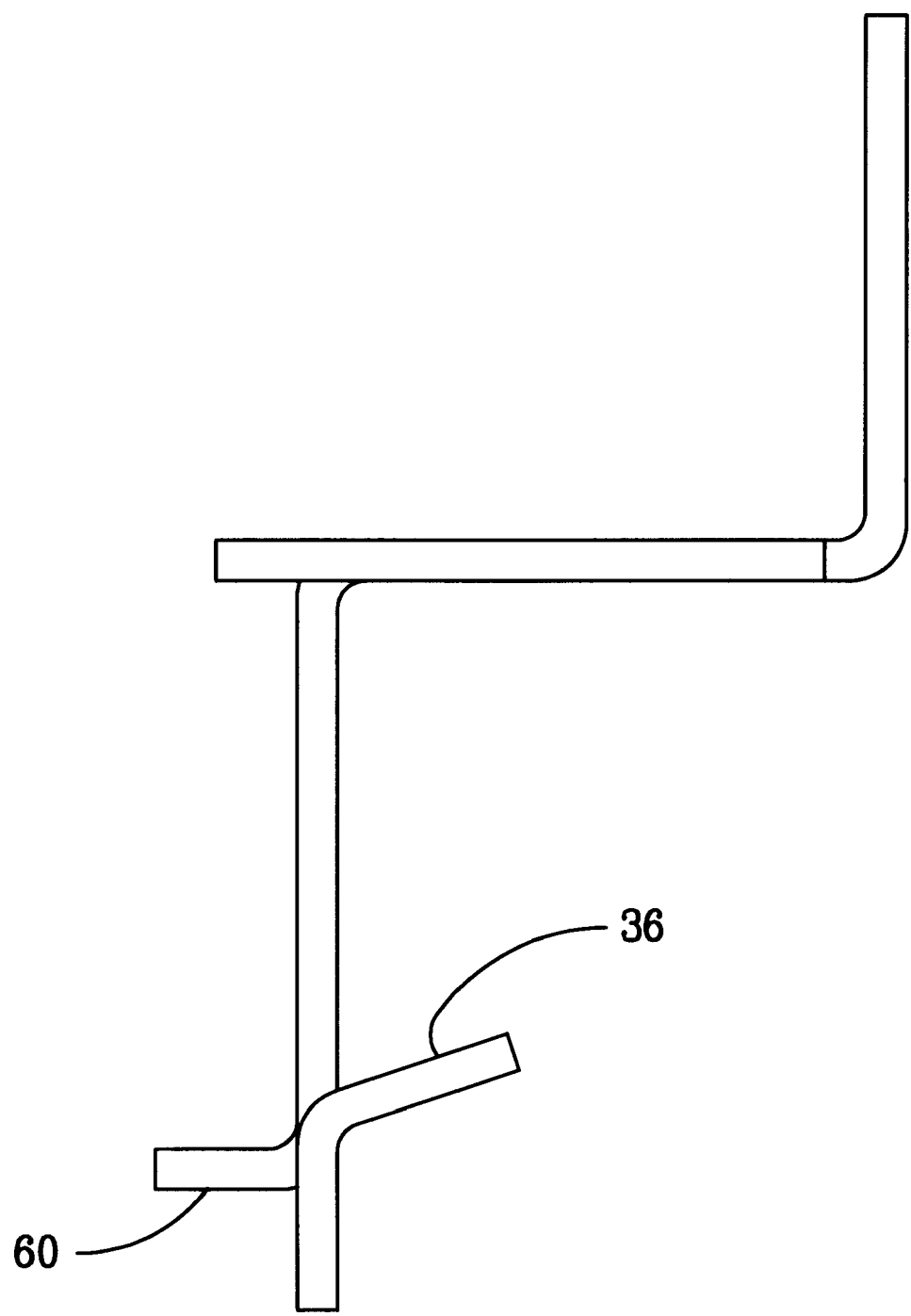
FIG. 12 shows a modification in which the blade of the clip has a nub to prevent sideways movement of the clip.

As shown in FIG. 12, the blade has a nub 60 which fits between two rows of fins. This prevents sideways motion of the frame. The nub 60 is bent out of the plane of the blade to form a notch in the blade. This notch can be used to secure a wire clip in the same manner as the cut-out 50 of FIGS. 1 and 4.

Other embodiments are within the true spirit and scope of the invention. The appended claims, are therefore, intended to cover all such embodiments.

What is claimed is:

1. The combination of a heat sink and a clip for securing said heat sink to a fan for cooling said heat sink comprising:

a clip having a rectangular, open, frame;

a blade extending downwardly from said frame;

a tab extending outwardly from said blade;

a heat sink having rows and columns of upstanding fins; and a projection on at least one of said fins of said heat sink, said tab engaging said projection for holding said frame on said heat sink.

2. The combination recited in claim 1 wherein the projection on said heat sink is a ridge on at least one of said upstanding fins.

3. The combination recited in claim 1 wherein the projection on said heat sink is a side of a notch in at least one of said fins.

4. The combination recited in claim 1 further comprising:

a plurality of said blades on said clip; and a projection on a plurality of said fins, a tab on each blade engaging projections on a fin to hold said frame in said heat sink.

5. A clip for securing a heat sink having upstanding parallel fins to a fan for cooling said sink comprising:

a rectangular, open, frame;

means adapted to secure said fan to said frame including upstanding corner posts on said frame adapted to engage said fan to secure it to said frame; and a blade extending downwardly from said frame adapted to bear against fins to secure said frame on said heat sink, said blade having a downwardly facing arcuate cutout which accommodates a wire clip adapted for securing said heat sink to a socket.

6. The clip recited in claim 5 wherein said frame includes two blades extending downwardly from opposite sides of said frame.

7. The clip recited in claim 5 further comprising:
means adapted to lock said frame to the fins of said heat sink.

8. The clip recited in claim 6, wherein said means adapted to lock includes tabs extending from said blade, said tabs extending upwardly and outwardly from a bend line along which said tabs are bent out of the plane of said blade to lockingly engage said fins against movement in the upward direction.

9. The clip recited in claim 5 wherein said frame is formed from a sheet of resilient metal.

10. The clip recited in claim 5 wherein said means for securing said fan to said frame includes upstanding corner posts adapted to engage said fan to secure it to said frame.

11. The clip recited in claim 10 wherein each corner post is bifurcated.

12. The clip recited in claim 11 wherein each corner post has a barb at the top thereof.

13. The clip recited in claim 5 wherein at least one edge of said frame is turned upwardly to form a strengthening rib to provide stability to said frame.

14. A clip for securing a heat sink having upstanding parallel to a fan for cooling said heat sink comprising:
a rectangular, open, frame;
means adaptive to secure said fan to said frame including upstanding corner posts on said frame adapted to engage said fan to secure to said frame;
a blade extending downwardly from said frame adapted to bear against said fins to secure said frame on said heat sink, and
at least one tab extending outwardly from said blade to lock said frame in said heat sink after it has been inserted.

15. The clip recited in claim 14 wherein said frame is formed from a sheet of said resilient metal.

16. The clip recited in claim 15 wherein the width of said sheet forms said blades, said blades abeing adapted to between said columns of pin fins.

17. The clip recited in claim 16 wherein said blade is adapted to span at least two rows of pin fins.

18. The clip recited in claim 14, wherein said means for securing said fan to said frame includes upstanding corner posts adapted to engage said fan to secure it to said frame.

19. The clip recited in claim 18 wherein each corner post is bifurated.

20. The clip recited in claim 18 wherein each corner post has a barb at the top thereof.

21. The clip recited in claim 14 wherein at least one edge of said frame is turned upwardly to form a strengthening rib to provide stability to said frame.

22. The clip recited in claim 14 wherein said blade has a downwardly facing arcuate cut-out which accommodates a wire clip adaptive for securing said heat sink to a socket.

23. An assembly including:
a pin fin heat sink having upstanding parallel fins;
a fan for cooling said heat sink;
a socket
an electronic device between said socket and said heat sink and
a clip for securing said heat sink to said fan comprising:
a rectangular, open frame;
means on said frame for securing said fan to said frame; and
a blade extending downwardly from said frame, said blade bearing against said fins to secure said frame on said heat sink, said blade having a downwardly facing arcuate cut-out which accommodates a wire clip to trap said wire clip in said heat sink.

24. An assembly including:
a pin fin heat sink having upstanding parallel fins;
a fan for cooling said heat sink;
a socket
an electronic device between said socket and said heat sink and
a clip for securing said heat sink to said fan comprising:
a rectangular, open frame;
means on said frame for securing said fan to said frame; and
a blade extending downwardly from said frame, said blade bearing against said fins to secure said frame to said heat sink, and
at least one tab extending outwardly from said blade to lock said frame in said heat sink.

* * * * *